United States Patent
Yamada

(10) Patent No.: US 8,014,213 B2
(45) Date of Patent: Sep. 6, 2011

(54) SEMICONDUCTOR MEMORY DEVICE

(75) Inventor: Junji Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 146 days.

(21) Appl. No.: 12/436,285

(22) Filed: May 6, 2009

(65) Prior Publication Data

US 2009/0285033 A1    Nov. 19, 2009

(30) Foreign Application Priority Data

May 14, 2008   (JP) .................................. 2008-127706

(51) Int. Cl.
G11C 7/10   (2006.01)

(52) U.S. Cl. .............. 365/189.05; 365/189.09; 365/200; 365/225.7

(58) Field of Classification Search ............... 365/225.7, 365/189.05, 189.07, 200
See application file for complete search history.

(56) References Cited

U.S. PATENT DOCUMENTS

| | | | | |
|---|---|---|---|---|
| 6,430,101 | B1 * | 8/2002 | Toda | 365/225.7 |
| 6,567,333 | B2 * | 5/2003 | Toda | 365/225.7 |
| 7,075,835 | B2 * | 7/2006 | Fujima | 365/200 |
| 7,411,845 | B2 * | 8/2008 | Kodama | 365/200 |

FOREIGN PATENT DOCUMENTS

| | | |
|---|---|---|
| JP | 2006-108394 | 4/2006 |
| JP | 2007-080302 | 3/2007 |

* cited by examiner

*Primary Examiner* — Pho M Luu
(74) *Attorney, Agent, or Firm* — Young & Thompson

(57) ABSTRACT

A semiconductor memory device is constituted of a plurality of fuses (or anti-fuses) used for internal voltage adjustment or timing adjustment after manufacturing, a selector for sequentially selecting the fuses, and a single-direction latch circuit for latching a fuse breakdown determination result which is produced by determining whether or not each fuse selected by the selector is broken down and which is varied in a single direction from the low level to the high level or in a single direction from the high level to the low level. The semiconductor memory device allows the fuse breakdown determination to progress with a high reliability by use of a relatively small chip area and to cope with a failure in which one or more fuses are accidentally short-circuited to an unwanted potential.

17 Claims, 9 Drawing Sheets

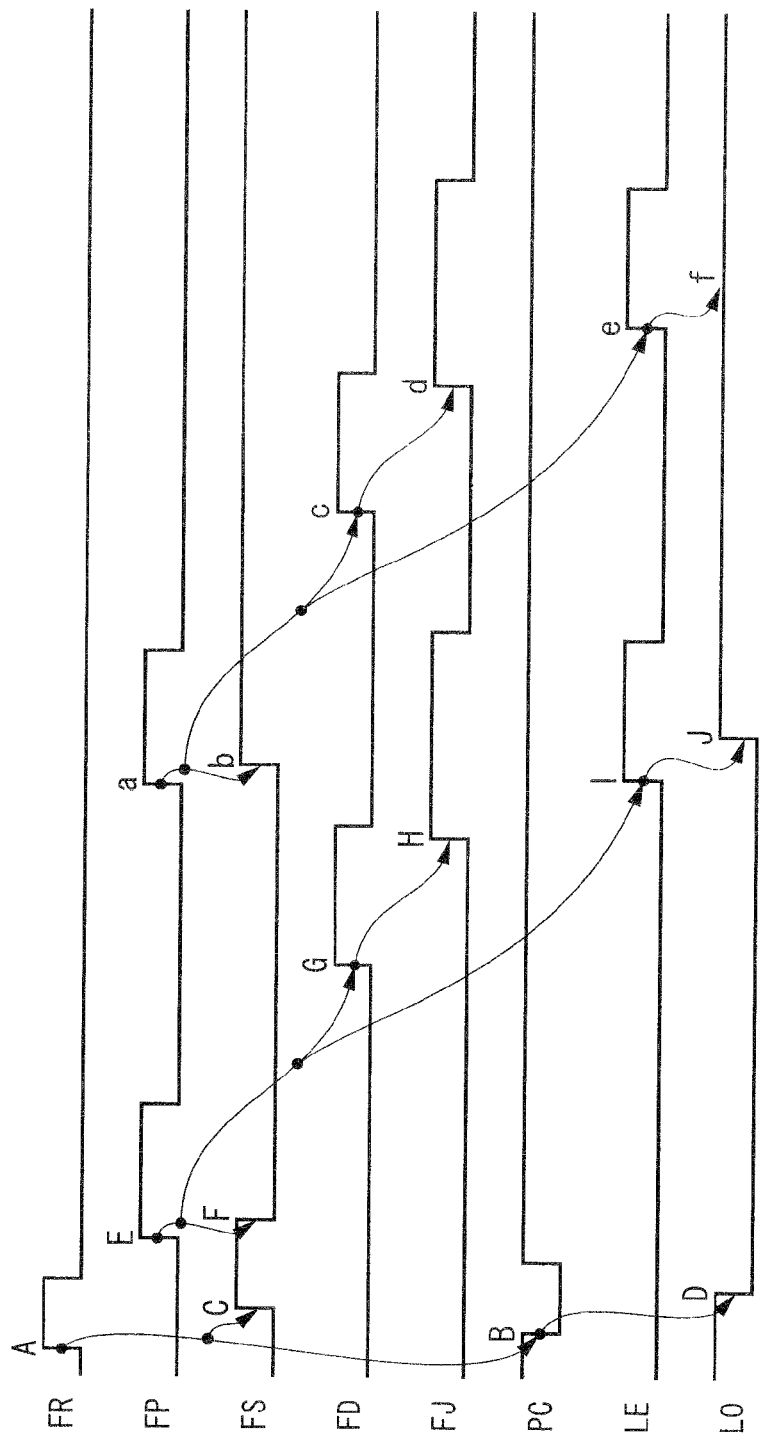

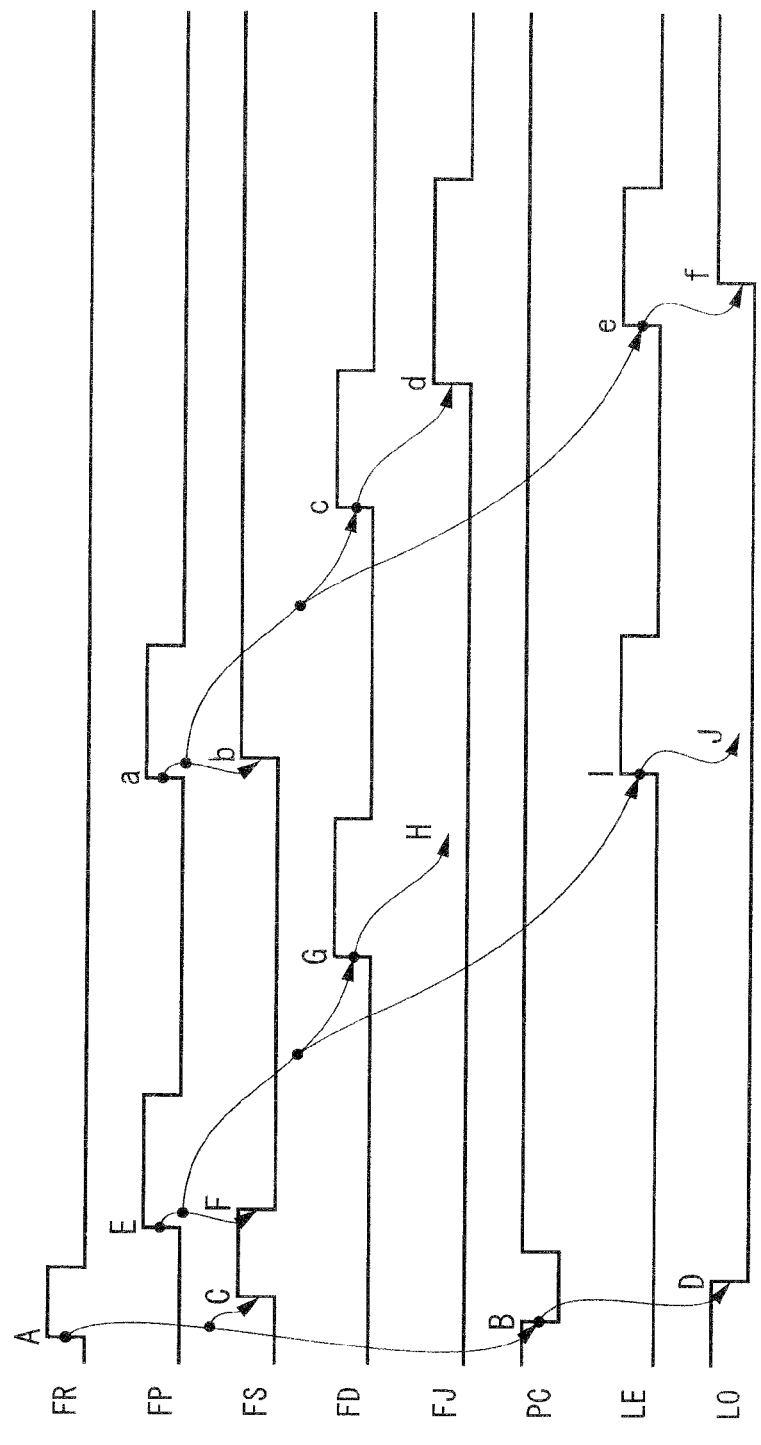

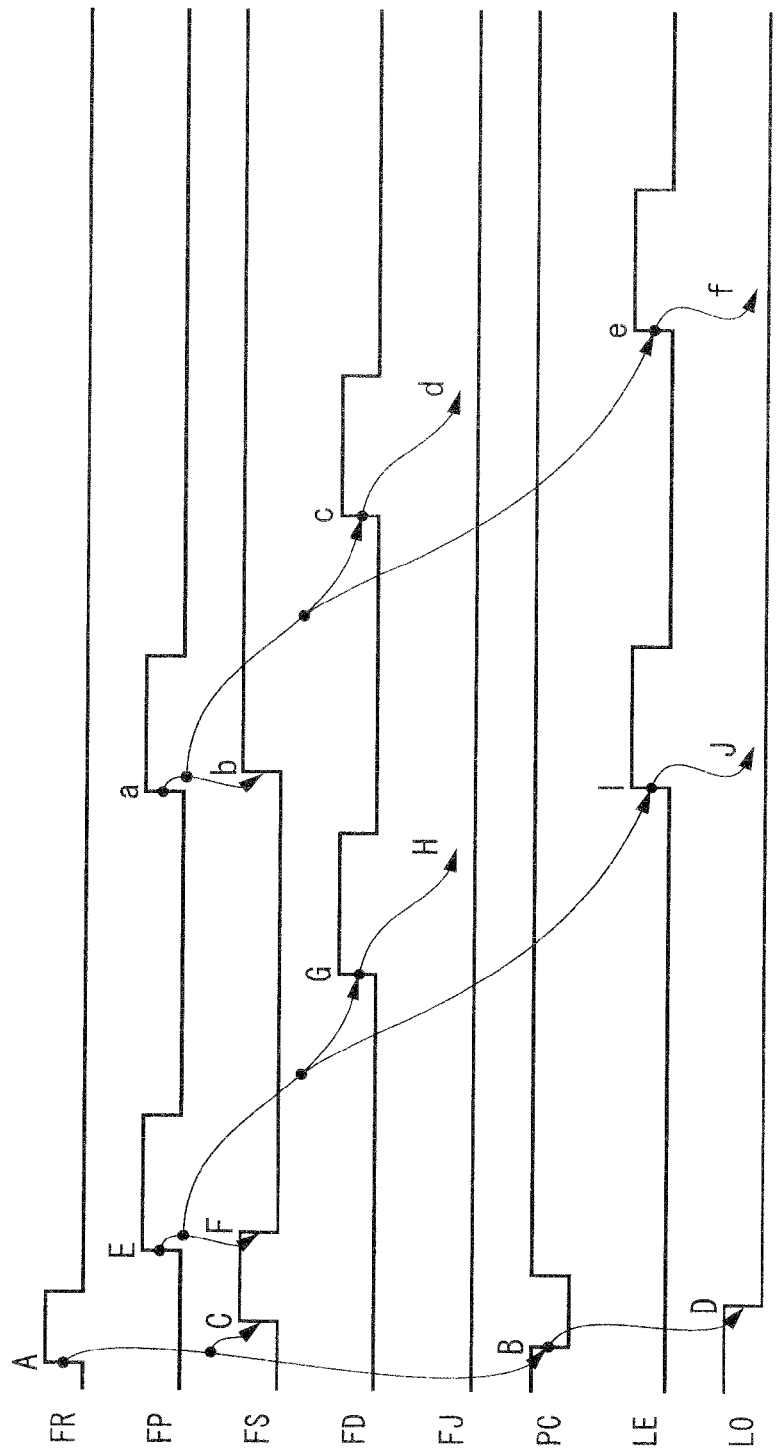

SEMICONDUCTOR MEMORY DEVICE

BACKGROUND OF THE INVENTION

1. Field of the Invention

The present invention relates to semiconductor memory devices using nonvolatile elements such as fuses subjected to laser beam cutting and electric breakdown.

The present application claims priority on Japanese Patent Application No. 2008-127706, the content of which is incorporated herein by reference.

2. Description of Related Art

Conventionally, semiconductor memory devices after manufacturing have been adjusted in terms of timing and internal voltages by use of fuses subjected to laser beam cutting and electric breakdown; however, they suffer from problems in that fuses once broken down are restored, or fuses not subjected to breakdown are accidentally broken down.

For this reason, semiconductor memory devices using fuses subjected to low-reliable electric breakdown are each inspected using two fuses for storing one-bit information, in which inspection is completed upon detection of breakdown of one fuse or upon detection of breakdown of both fuses, thus securing a high reliability.

Various technologies have been developed and disclosed in various documents such as Patent Documents 1 and 2 with respect to methods of determinations (or judgments) of breakdowns of fuses used in semiconductor memory devices.

Patent Document 1: Japanese Unexamined Patent Application Publication No. 2007-80302

Patent Document 2: Japanese Unexamined Patent Application Publication No. 2006-108394

Patent Document 1 teaches a semiconductor integrated circuit employing a fuse breakdown determination (judgment) method in which two fuses are connected together via a MOS switch so as to operate as an OR circuit, which can perform an OR operation by use of a relatively small area of circuitry. In this method, however, when a failure occurs such that one fuse is short-circuited to a wrong potential which should not be normally connected thereto, the OR circuit cannot operate properly.

Patent Document 2 teaches a semiconductor device using a fuse circuit in which two latch circuits are arranged to store breakdown states of two fuses respectively and are followed by a logic circuit serving as an OR circuit or an AND circuit, thus securing a high reliability in determination of breakdown of fuses.

FIG. 9 shows an example of a semiconductor memory device which is designed based on Patent Document 2, wherein two fuses 101 and 102 are coupled to a fuse breakdown determination judgment) circuit 105 via a selector 104. The fuse breakdown determination circuit 105 determines the breakdown of the fuse 101 or 102 selected by the selector 104, thus outputting a high-level signal. The fuse breakdown determination circuit 105 is followed by latch circuits 106 and 107, AND circuits 108 and 109, and an OR circuit 110. When the fuse breakdown determination circuit 105 determines that one of the fuses 101 and 102 is placed in a breakdown state, the OR circuit 110 outputs a high-level signal, thus completing fuse breakdown determination.

The present inventor has recognized that the semiconductor memory device of FIG. 9 suffers from complexity in which the two fuses 101 and 102 are followed by the two latch circuits 106 and 107. FIG. 10 shows the detailed constitution of the latch circuit 106 (or 107), which needs an OR circuit or an AND circuit in addition to the OR circuit 110. This increases the overall area of circuitry of the semiconductor memory device.

SUMMARY

The invention seeks to solve the above problem, or to improve upon the problem at least in part.

In one embodiment of the present invention, a semiconductor device is constituted of a plurality of nonvolatile elements, and a flip-flop having a set terminal and a reset terminal, which stores a plurality of determination results with respect to the plurality of nonvolatile elements, wherein an output terminal of the flip-flop is changed from a first logic level, which is initially set to the flip-flop via the reset terminal to a second logic level in response to the plurality of determination results sequentially input into the set terminal of the flip-flop.

In another embodiment of the present invention, a semiconductor device is constituted of a plurality of fuses or anti-fuses, a selector for sequentially selecting the fuses or anti-fuses, and a single-direction latch circuit for latching a fuse breakdown determination result representing a breakdown of the fuse or anti-fuse selected by the selector only when the fuse breakdown determination result is varied in a single direction from the low level to the high level or in a single direction from the high level to the low level.

In a further embodiment of the present invention, a semiconductor device is constituted of a plurality of fuses or anti-fuses, and a single-direction latch circuit for sequentially inputting a plurality of fuse breakdown determination results regarding the plurality of fuses or anti-fuses, thus outputting a logical sum or a logical product based on the fuse breakdown determination results.

BRIEF DESCRIPTION OF THE DRAWINGS

The above features and advantages of the present invention will be more apparent from the following description of certain preferred embodiments taken in conjunction with the accompanying drawings, in which:

FIG. 4A shows the waveform of a fuse breakdown determination reset signal FR in a first mode where two fuses 1 and 2 shown in FIG. 1 are both normally broken down;

FIG. 4B shows the waveform of a fuse breakdown pulse signal FP in the first mode;

FIG. 4C shows the waveform of a fuse select signal FS in the first mode;

FIG. 4D shows the waveform of a fuse breakdown determination signal FD in the first mode;

FIG. 4E shows the waveform of a fuse breakdown determination result FJ in the first mode;

FIG. 4F shows the waveform of a precharge signal PC in the first mode;

FIG. 4G shows the waveform of a latch enable signal LE in the first mode;

FIG. 4H shows the waveform of a latch output signal LO in the first mode;

FIG. 6A shows the waveform of the fuse breakdown determination reset signal FR in a third mode where the fuse 1 is not broken down but the fuse 2 is broken down;

FIG. 6B shows the waveform of the fuse breakdown pulse signal FP in the third mode;

FIG. 6C shows the waveform of the fuse select signal FS in the third mode;

FIG. 6D shows the waveform of the fuse breakdown determination signal FD in the third mode;

FIG. 6E shows the waveform of the fuse breakdown determination result FJ in the third mode;

FIG. 6F shows the waveform of the precharge signal PC in the third mode;

FIG. 6G shows the waveform of the latch enable signal LE in the third mode;

FIG. 6H shows the waveform of the latch output signal LO in the third mode;

FIG. 7A shows the waveform of the fuse breakdown determination reset signal FR in a fourth mode where both the fuses 1 and 2 are not broken down;

FIG. 7B shows the waveform of the fuse breakdown pulse signal FP in the fourth mode;

FIG. 7C shows the waveform of the fuse select signal FS in the fourth mode;

FIG. 7D shows the waveform of the fuse breakdown determination signal FD in the fourth mode;

FIG. 7E shows the waveform of the fuse breakdown determination result FJ in the fourth mode;

FIG. 7F shows the waveform of the precharge signal PC in the fourth mode;

FIG. 7G shows the waveform of the latch enable signal LE in the fourth mode;

FIG. 7H shows the waveform of the latch output signal LO in the fourth mode;

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
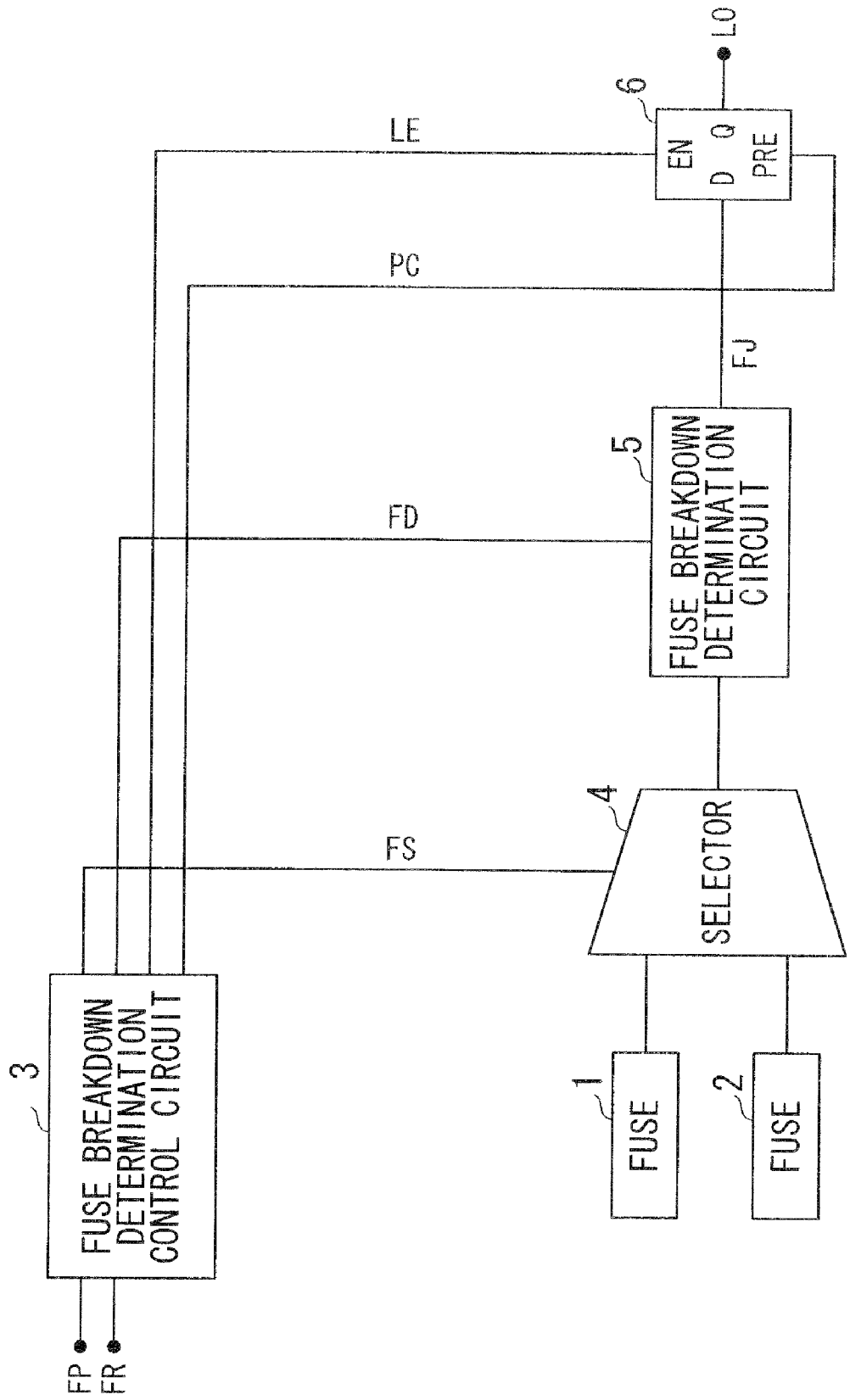
FIG. 1 is a circuit diagram showing the constitution of a semiconductor memory device according to a first embodiment of the present invention.
Figure 2:
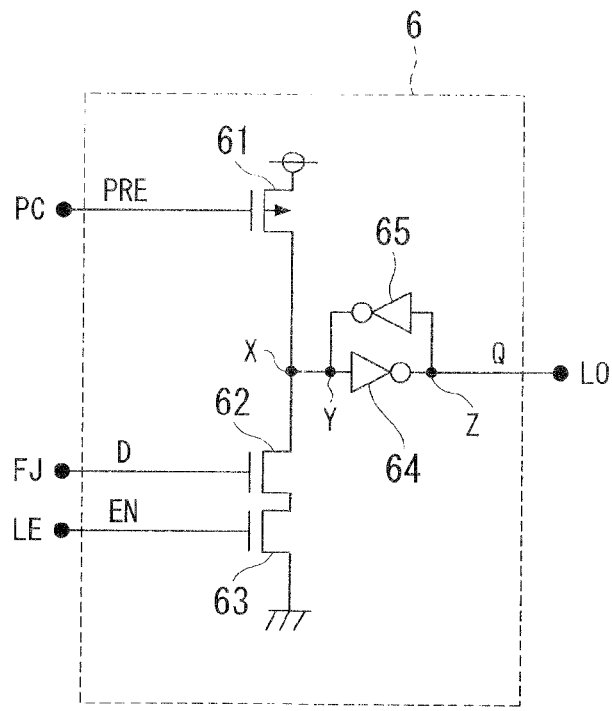
FIG. 2 is a circuit diagram showing the constitution of a single-direction latch circuit included in the semiconductor memory device of FIG. 1.
Figure 3:
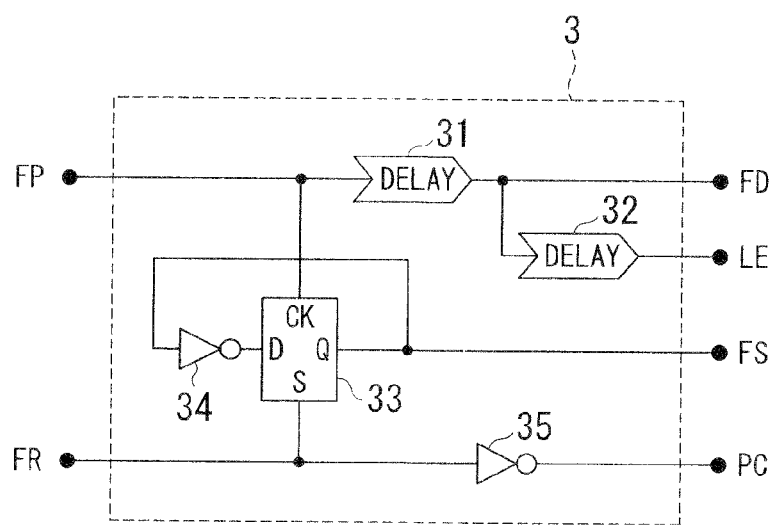
FIG. 3 is a circuit diagram showing the constitution of a fuse breakdown determination control circuit included in the semiconductor memory device of FIG. 1.
Figures 5A, 5B, 5C, 5D, 5E, 5F, 5G, 5H:
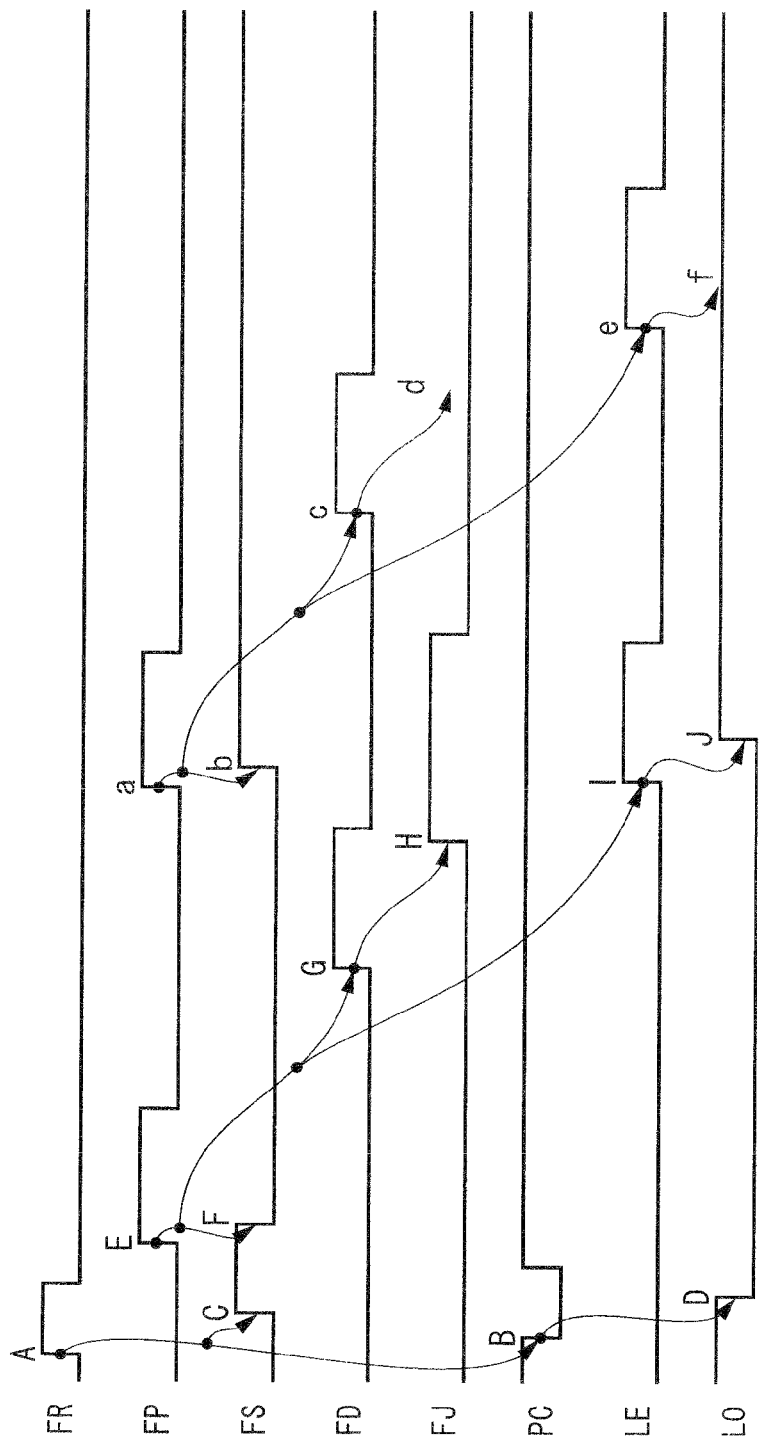
FIG. 5A shows the waveform of the fuse breakdown determination reset signal FR in a second mode where the fuse 1 is broken down but the fuse 2 is not broken down.
FIG. 5B shows the waveform of the fuse breakdown pulse signal FP in the second mode.
FIG. 5C shows the waveform of the fuse select signal FS in the second mode.
FIG. 5D shows the waveform of the fuse breakdown determination signal FD in the second mode.
FIG. 5E shows the waveform of the fuse breakdown determination result FJ in the second mode.
FIG. 5F shows the waveform of the precharge signal PC in the second mode.
FIG. 5G shows the waveform of the latch enable signal LE in the second mode.
FIG. 5H shows the waveform of the latch output signal LO in the second mode.

A semiconductor memory device according to a first embodiment of the present invention will be described with reference to FIGS. 1 to 3, wherein the same parts are designated by the same reference numerals. FIG. 1 is a circuit diagram showing the constitution of the semiconductor memory device of the first embodiment. FIG. 2 is a circuit diagram showing the detailed constitution of a single-direction latch circuit 6 shown in FIG. 1. FIG. 3 is a circuit diagram showing the detailed constitution of a fuse breakdown determination control circuit 3 shown in FIG. 1.

The semiconductor memory device of the present embodiment is designed to use a plurality of fuses each of which stores 1-bit information, whereas FIG. 1 shows two fuses 1 and 2 each storing 1-bit information installed in the semiconductor memory device.

The semiconductor memory device of FIG. 1 includes a fuse breakdown determination (judgment) control circuit 3, which generates a fuse select signal FS (serving as a first control signal), a fuse breakdown determination signal FD (serving as a fourth control signal), a latch enable signal LE (serving as a third control signal), and a precharge signal PC (serving as a second control signal) based on a fuse breakdown determination reset signal FR (serving as a reset signal) and a fuse breakdown pulse signal FP (serving as a control signal) from an external device (not shown), in connection with the fuses 1 and 2 (or nonvolatile elements). The external device generates the fuse breakdown determination reset signal FR and the fuse breakdown pulse signal FP in the form of high-level pulses upon the activation of the semiconductor memory device. In the following description, potentials at various points of the circuitry are arbitrarily set to a high level or a low level.

The semiconductor memory device of FIG. 1 further includes a selector 4 for selecting one of the fuses 1 and 2 based on the fuse select signal FS and a fuse breakdown determination judgment) circuit 5 for determining the breakdown of the selected fuse 1 or 2 based on the fuse breakdown determination signal FD.

The semiconductor memory device of FIG. 1 further includes a single-direction latch circuit 6 (e.g. an R-S flip-flop) which receives and stores a fuse breakdown determination result FJ output from the fuse breakdown determination circuit 5 so as to latch it in only a single direction from a low level to a high level based on the latch enable signal LE and the precharge signal PC.

The level of an terminal Q of the single-direction latch circuit 6 depends upon the precharge signal PC input to a reset terminal (or a precharge terminal) PRE and the fuse breakdown determination result FJ input to a set terminal (or a data terminal) D. According to the basic concept of the present embodiment, it may be easy for those skilled in the art to realize that the single-direction latch circuit 6 is not necessarily constituted of two inverters (see FIG. 2), hence, the prescribed operation and effect can be achieved using a single flip-flop having the set terminal and the reset terminal.

Specifically, the precharge signal PC output from the fuse breakdown determination control circuit 3 is supplied to the precharge terminal (or reset terminal) PRE of the single-direction latch circuit 6, while the latch enable signal LE is supplied to an enable terminal EN of the single-direction latch circuit 6. The fuse breakdown determination result FJ output from the fuse breakdown determination circuit 5 is supplied to the data terminal (or set terminal) D of the single-direction latch circuit 6. A latch output signal LO is output from an output terminal Q of the single-direction latch circuit 6.

Next, the circuit configuration of the single-direction latch circuit 6 will be described with reference to FIG. 2. The single-direction latch circuit 6 includes a first PMOS transistor 61 (serving as a first-conduction-type field-effect transistor), a first NMOS transistor 62 (serving as a second-conduction-type field effect transistor), and a second NMOS transistor 63, which are connected in series between a power-supply potential (or a high-level potential) and a ground potential (or a low-level potential).

Specifically, the source of the first PMOS transistor 61 is connected to the power-supply potential, and the drain thereof is connected to the drain of the first NMOS transistor 62. The source of the first NMOS transistor 62 is connected to the drain of the second NMOS transistor 63. The source of the second NMOS transistor 63 is connected to the ground potential.

The single-direction latch circuit 6 further includes an output inverter 64 and a feedback inverter 65. The input terminal of the output inverter 64 is connected to a connection node X between the drain of the first PMOS transistor 61 and the drain of the first NMOS transistor 62. The input terminal of the feedback inverter 65 is coupled to the output terminal of the output inverter 64, while the output terminal thereof is coupled to the input terminal of the output inverter 64.

In this connection, the output terminal of the feedback inverter 65 is connected to a connection node Y, which is formed between the input terminal of the output inverter 64 and the output terminal of the feedback inverter 65, as well as the connection node X between the first PMOS transistor 61 and the first NMOS transistor 62.

The gate of the first PMOS transistor 61 corresponds to the precharge terminal PRE of the single-direction latch circuit 6, which receives the precharge signal PC output from the fuse breakdown determination control circuit 3. The gate of the first NMOS transistor 62 corresponds to the data terminal D of the single-direction latch circuit 6, which receives the fuse breakdown determination result FJ output from the fuse breakdown determination circuit 5.

The gate of the second NMOS transistor 63 corresponds to the enable terminal EN of the single-direction latch circuit 6, which receives the latch enable signal LE output from the fuse breakdown determination circuit 3. The output terminal of the output inverter 64 (i.e. a connection node Z formed between the output terminal of the output inverter 64 and the input terminal of the feedback inverter 65) corresponds to the output terminal Q of the single-direction latch circuit 6, which outputs the latch output signal LO.

Next, the circuit configuration of the fuse breakdown determination control circuit 3 will be described with reference to FIG. 3. The fuse breakdown determination control circuit 3 includes a first delay circuit 31, a second delay circuit 32 whose input terminal is connected to the output terminal of the first delay circuit 31, a D-type flip-flop 33 having a non-synchronous set terminal S, a first inverter 34, and a second inverter 35.

The fuse breakdown pulse signal FP is supplied to the input terminal of the first delay circuit 31 and a clock terminal CK of the D-type flip-flop 33. The fuse breakdown determination reset signal FR is supplied to the non-synchronous set terminal S of the D-type flip-flop 33 and the input terminal of the second inverter 35.

The output signal of the first delay circuit 31 is supplied to the input terminal of the second delay circuit 32 and is also supplied to the fuse breakdown determination circuit 5 as the fuse breakdown determination signal FD. The output signal of the second delay circuit 32 is supplied to the single-direction latch circuit 6 as the latch enable signal LE. The output signal of the second inverter 35 is supplied to the precharge terminal PRE of the single-direction latch circuit 6 as the precharge signal PC.

The fuse select signal FS is output from an output terminal Q of the D-type flip-flop 33 toward the selector 4 and is also supplied to the first inverter 34. The output signal of the first inverter 34 is supplied to a data terminal D of the D-type flip-flop 33.

The external device outputs the fuse breakdown determination reset signal FR (i.e. a pulse signal) at the start timing of the fuse breakdown determination and subsequently outputs the fuse breakdown pulse signal FP including a number of pulses dependent upon the number of fuses or anti-fuses. The fuse breakdown determination control circuit 3 generates the precharge signal PC, the fuse select signal FS, the fuse breakdown determination signal FD, and the latch enable signal LE based on the fuse breakdown determination reset signal FR and the fuse breakdown pulse signal FP.

That is, the fuse breakdown determination control circuit 3 outputs the precharge signal PC to the single-direction latch circuit 6, thus resetting latched data. In addition, the fuse breakdown determination control circuit 3 outputs the fuse select signal FS to the selector 4, thus selecting one of the fuses 1 and 2. Furthermore, the fuse breakdown determination control circuit 3 sequentially outputs the fuse breakdown determination signal FD to the fuse breakdown determination circuit 5, thus performing determination as to whether or not the selected fuse 1 or 2 is broken down. The fuse breakdown determination control circuit 3 outputs the latch enable signal LE to the single-direction latch circuit 6, thus latching the fuse breakdown determination result FJ produced by the fuse breakdown determination circuit 5.

Figure 9:
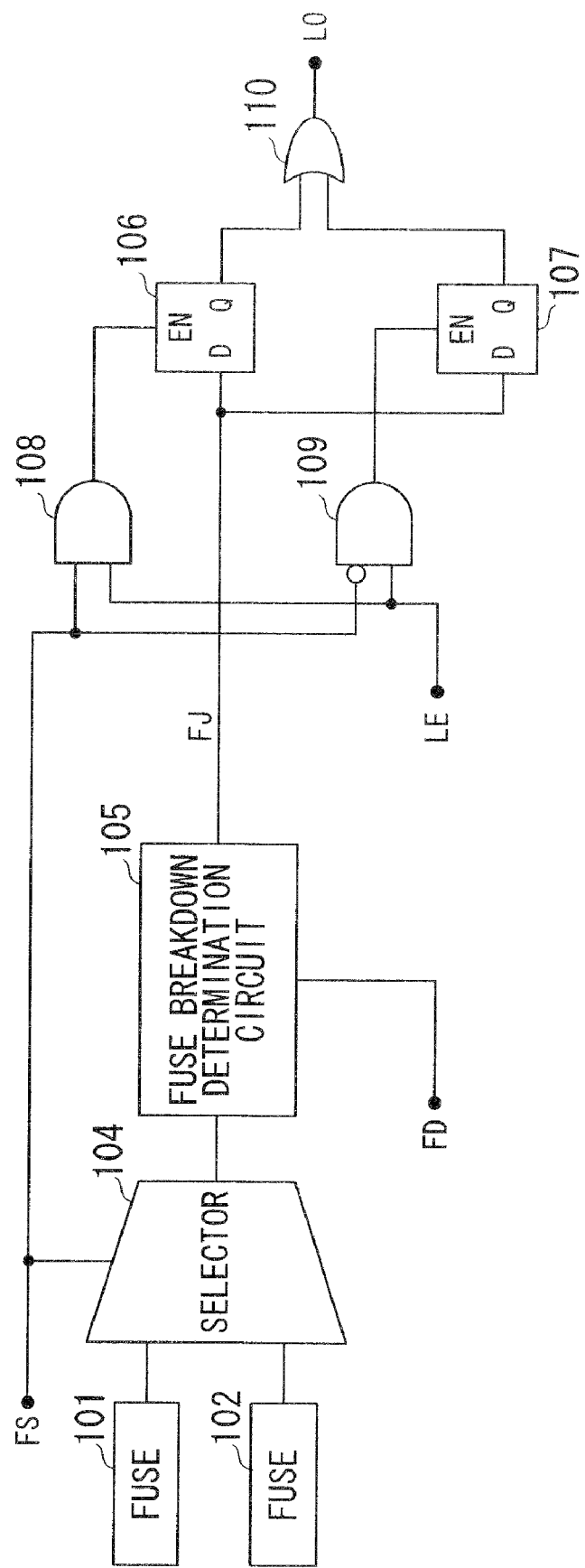
FIG. 9 is a circuit diagram showing an example of a semiconductor memory device including a fuse breakdown determination circuit for determining breakdown of two fuses.

Compared to the foregoing semiconductor memory device of FIG. 9 including the two latch circuits 106 and 107, the semiconductor memory device of FIG. 1 includes only one single-direction latch circuit 6. Thus, it is possible to reduce the number of latch circuits in the semiconductor memory device of FIG. 1 compared to the foregoing semiconductor memory device of FIG. 9.

Figure 10:
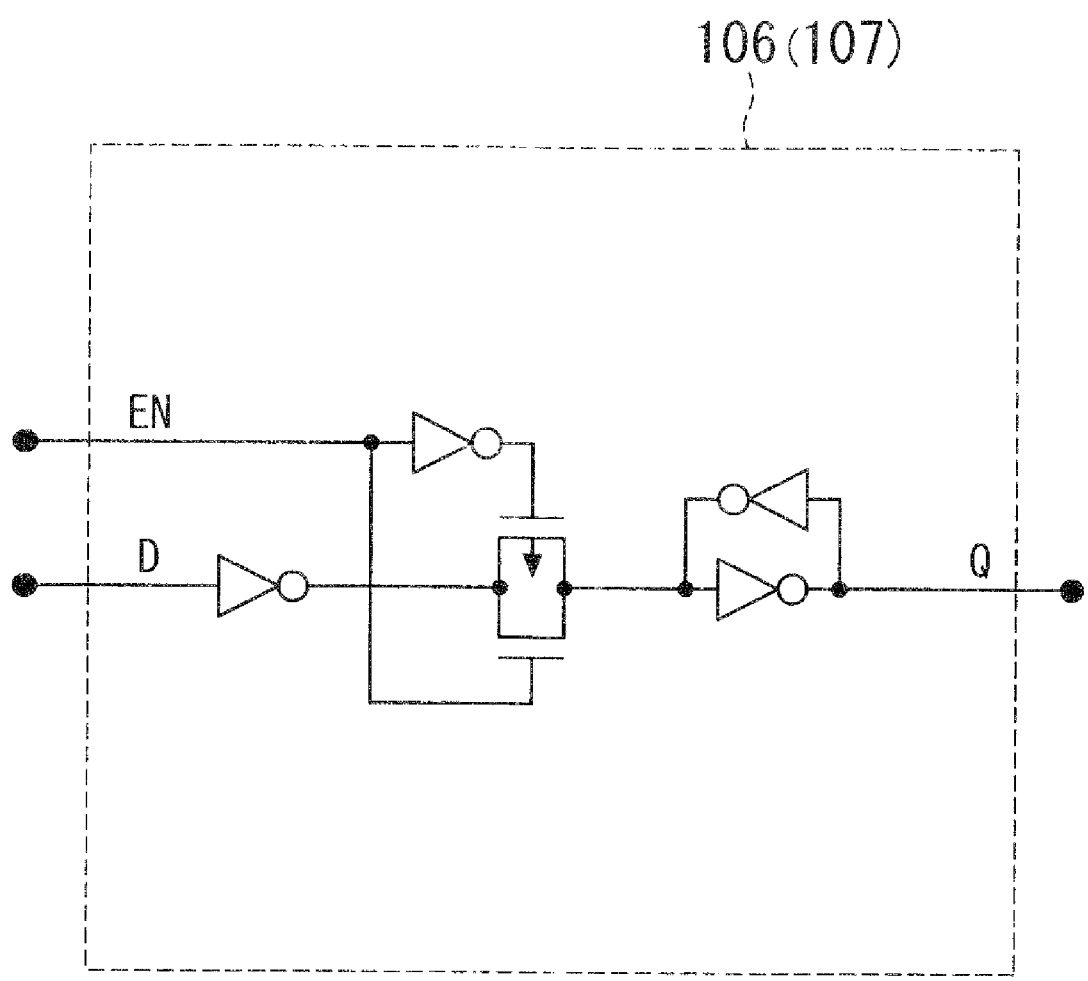
FIG. 10 is a circuit diagram showing the detailed constitution of a latch circuit adapted to each fuse.

As shown in FIG. 10, each of the latch circuits 106 and 107 includes a CMOS inverter consisting of a PMOS transistor and an NMOS transistor; hence, the total number of MOS transistors is four. In contrast, the single-direction latch circuit 6 includes three MOS transistors 61-63; that is, the scale of the circuitry of the single-direction latch circuit 6 is smaller than the scale of the circuitry including the latch circuits 106 and 107.

Therefore, the overall circuit scale of the semiconductor memory device shown in FIGS. 1 and 2 is smaller than that of the foregoing semiconductor memory device shown in FIGS. 9 and 10; hence, the present embodiment can be fabricated with a relatively small area of circuitry.

Compared to the foregoing semiconductor memory device shown in FIGS. 9 and 10, the semiconductor memory device of FIG. 1 additionally includes the use breakdown determination control circuit 3 of FIG. 3. However, only one fuse breakdown determination control circuit 3 is can be accommodated for a number of fuses without substantially increasing the overall area of circuitry.

Next, the operation of the semiconductor memory device shown in FIGS. 1 to 3 will be described with reference to FIGS. 4A-4H, FIGS. 5A-5H, and FIGS. 6A-6H. Similar to the foregoing semiconductor memory device of FIG. 9, the semiconductor memory device of FIG. 1 achieves fuse breakdown determination with a high reliability in accordance with predetermined procedures, which will be described below.

The present embodiment is designed such that the selector 4 selects the fuse 1 when the fuse select signal FS becomes a low level, while it selects the fuse 2 when the fuse select signal FS becomes a high level. The fuse breakdown determination circuit 5 outputs a high-level signal as the fuse breakdown determination result FJ when it determines that the selected fuse 1 or 2 is broken down. The fuse breakdown determination circuit 5 outputs a low-level signal as the fuse breakdown determination result FJ when it determines that the selected fuse 1 or 2 is broken down.

The following description is made based on the premise that after reception of a high-level pulse of the fuse breakdown determination reset signal FR, the semiconductor memory device of FIG. 1 sequentially receives a plurality of high-level pulses of the fuse breakdown pulse signal FP in which the number of high-level pulses corresponds to the number of fuses installed therein. Since the semiconductor memory device of FIG. 1 includes the two fuses 1 and 2, it receives two high-level pulses of the fuse breakdown pulse signal FP after reception of one high-level pulse of the fuse breakdown determination reset signal FR.

Within two high-level pulses of the fuse breakdown pulse signal FP sequentially inputted into the semiconductor memory device of FIG. 1, the first one is referred to as a first fuse breakdown pulse, and the second one is referred to as a second fuse breakdown pulse.

(1) First Mode

The operation of the semiconductor memory device will be described with reference to FIGS. 4A-4H in respect of a first mode where both the fuses 1 and 2 are normally broken down.

The fuse breakdown determination is started by the external device supplying a high-level pulse of the fuse breakdown determination reset signal FR to the fuse breakdown determination control circuit 3 (see point A in FIG. 4A), wherein the second inverter 35 outputs the precharge signal PC at a low level (see point B in FIG. 4F), while the D-type flip-flop 33 is reset to a high level so as to output the fuse select signal FS at a high level (see point C in FIG. 4C).

Since the D-type flip-flop 33 outputs the high-level fuse select signal FS from the output terminal Q, the data terminal D thereof receives a low-level signal via the first inverter 34 inverting the high-level fuse select signal FS.

The fuse breakdown determination control circuit 3 supplies the low-level precharge signal PC to the precharge terminal PRE of the single-direction latch circuit 6, thus resetting the latch output signal LO to a low level (see point D in FIG. 4H). In the single-direction latch circuit 6 shown in FIG. 2, the connection node X is pre-charged at a high level due to the low-level input of the precharge terminal PRE, thus changing the potential of the output terminal Q to a low level. Once the potential of the connection node X becomes high, such a high-level potential is maintained at the connection node X by way of the operation of the feedback inverter 65, so that the low-level potential is maintained at the output terminal Q.

Next, when the first fuse breakdown pulse at a high level is supplied to the clock terminal CK of the D-type flip-flop 33 (see point E in FIG. 4B), the low-level signal presently supplied to the data terminal D is set to the D-type flip-flop 33, which thus sets the fuse select signal FS at a low level (see point F in FIG. 4C). Upon reception of the low-level fuse select signal FS output from the D-type flip-flop 33 of the fuse breakdown determination control circuit 3, the selector 4 selects the fuse 1.

The first inverter 34 inverts the low-level fuse select signal FS into a high-level signal, which is then supplied to the data terminal D of the D-type flip-flop 33.

The first delay circuit 31 delays the first fuse breakdown pulse by a first delay time, thus generating the fuse breakdown determination signal FD at a high level (see point G in FIG. 4D). The high-level fuse breakdown determination signal FD is supplied to the fuse breakdown determination circuit 5.

The first delay time of the first delay circuit 31 used for delaying the fuse breakdown pulse signal FP is set to 10 ns, for example. Specifically, the first delay time corresponds to a prescribed period for the fuse breakdown determination circuit 5 starting the fuse breakdown determination on the selected fuse 1 or 2 after being selected by the selector 4 in response to the fuse select signal FS.

Upon reception of the high-level fuse breakdown determination signal FD while the fuse 1 is being selected by the selector 4, the fuse breakdown determination circuit 5 performs fuse breakdown determination on the selected fuse 1.

In the first mode where both the fuses 1 are broken downs the fuse breakdown determination circuit 5 outputs the fuse breakdown determination result FJ at a high level after a lapse of a prescribed time secured for the fuse breakdown determination (see point H in FIG. 4E).

In the fuse breakdown determination control circuit 3, the fuse breakdown pulse signal FP is delayed by the first delay circuit 31 and the second delay circuit 32, thus generating the latch enable signal LE at a high level (see point I in FIG. 4G).

The total delay time secured by the first delay circuit 31 and the second delay circuit 32 sequentially delaying the fuse breakdown pulse signal FP is set to 20 ns, for example. Since the first delay circuit 31 has the first delay time of 10 ns, the second delay circuit 32 has a second delay time of 10 ns.

The second delay time of the second delay circuit 32 is predetermined to allow the single-direction latch circuit 6 to set up and latch the fuse breakdown determination result FJ (supplied to the data terminal D from the fuse breakdown determination circuit 5) in response to the latch enable signal LE.

The high-level latch enable signal LE generated by the fuse breakdown determination control circuit 3 is supplied to the enable terminal EN of the single-direction latch circuit 6, so that the single-direction latch circuit 6 latches the fuse breakdown determination result FJ therein.

In the single-direction latch circuit 6 shown in FIG. 2, the potential of the connection node X is reset to a low level based on the high-level fuse breakdown determination result FJ and the high-level latch enable signal LE, so that the latch output signal LO of the single-direction latch circuit 6 reaches a high level (see point J in FIG. 4H).

In other words, when both the fuse determination result FJ and the latch enable signal LE (at the data terminal D and the enable terminal EN of the single-direction latch circuit 6) become high, the potential of the connection node X becomes low, so that the latch output signal LO (at the output terminal Q) becomes high.

Next, when the external device supplies the fuse breakdown determination control circuit 3 of the semiconductor memory device with the second fuse breakdown pulse at a high level (see point "a" in FIG. 4B), a high-level signal is supplied to the data terminal D of the D-type flip-flop 33 via the first inverter 34, so that the fuse select signal FS output from the D-type flip-flop 33 is changed from a low level to a high level (see point b in FIG. 4C).

The selector 4 selects the fuse 2 in response to the high-level fuse select signal FS; then, in a manner similar to the fuse 1 being selected by the selector 4, the fuse breakdown determination signal FD and the latch enable signal LE sequentially reach high levels (see points c and e in FIGS. 4D and 4G), so that the single-direction latch circuit 6 latches the fuse breakdown determination result FJ regarding the fuse 2 therein.

Since the fuse 2 is normally broken down so that the fuse breakdown determination result FJ is at a high level (see point d in FIG. 4E), the single-direction latch circuit 6 latches the high-level fuse breakdown determination result FJ with respect to the fuse 2 similarly to the fuse 1. This operation is realized such that the potential of the connection node X decreases to a low level in the single-direction latch circuit 6 shown in FIG. 2. Since the potential of the connection node X already decreases to the low level based on the fuse breakdown determination result FJ regarding the fuse 1 so that the low level is maintained by way of the feedback inverter 65, the latch output signal LO is still maintained at the high level (see point f in FIG. 4H).

In short, the semiconductor memory device continuously outputs the high-level latch output signal LO in the first mode where both the fuses 1 and 2 are normally broken down.

(2) Second Mode

The operation of the semiconductor memory device will be described with reference to FIGS. 5A-5H in respect of a second mode where the fuse 1 is broken down but the fuse 2 is not broken down.

Since the fuse 1 is broken down in the second mode shown in FIGS. 5A-5H, the fuse breakdown determination regarding the fuse 1 is performed in a similar manner to the first mode shown in FIGS. 4A-4H, wherein after the fuse breakdown determination control circuit 3 receives the first fuse breakdown pulse from the external device, the fuse breakdown determination result FJ regarding the fuse 1 is supplied to the single-direction latch circuit 6. After completion of the fuse breakdown determination regarding the fuse 1, the potential of the connection node X of the single-direction latch circuit 6 is set to a low level, so that the latch output signal LO is maintained at a high level (see points A to J in FIGS. 5A-5H).

Next, the fuse breakdown determination control circuit 3 receives the second fuse breakdown pulse from the external device (see point "a" in FIG. 5B), the fuse select signal FS is changed from the low level to the high level (see point b in FIG. 5C), thus allowing the selector 4 to select the fuse 2. Then, the fuse breakdown determination signal FD and the latch enable signal LE are sequentially changed from the low level to the high level (see points c and e in FIGS. 5D and 5G), so that the single-direction latch circuit 6 latches the fuse breakdown determination result FJ regarding the fuse 2 from the fuse breakdown determination circuit 5.

In the second mode in which the fuse 2 is not broken down, the fuse breakdown determination circuit 5 outputs the fuse breakdown determination result FJ at a low level (see point d in FIG. 5E), which is supplied to the data terminal D of the single-direction latch circuit 6 in response to the high-level latch enable signal LE.

The single-direction latch circuit 6 shown in FIG. 2 clearly shows that the potential of the connection node X is not changed at the above timing; that is, no potential change occurs in the single-direction latch circuit 6. Once the breakdown of the fuse 1 is determined so that the latch output signal LO of the single-direction latch circuit 6 is set to the high level, the internal potential condition of the single-direction latch circuit 6 is not changed irrespective of the determination of the non-breakdown of the fuse 2; hence, the latch output signal LO is maintained at the high level (see point f in FIG. 5H).

In short, the semiconductor memory device continuously outputs the high-level latch output signal LO in the second mode in which the fuse 1 is broken down but the fuse 2 is not broken down.

(3) Third Mode

The operation of the semiconductor memory device will be described with reference to FIGS. 6A-6H in respect of a third mode where the fuse 1 is not broken down but the fuse 2 is broken down. The third mode of FIGS. 6A-6H is similar to the first mode of FIGS. 4A-4H to such an extent that upon reception of the high-level fuse breakdown determination reset signal FR from the external device, the fuse breakdown determination control circuit 3 outputs the precharge signal PC so as to set the latch output signal LO of the single-direction latch circuit 6 to the low level (see points A to D in FIGS. 6A, 6C, 6F, and 6H).

Similar to the first mode of FIGS. 4A-4H, the fuse breakdown determination control circuit 3 starts the fuse breakdown determination on the fuse 1 in response to the first fuse breakdown pulse from the external device (see point E in FIG. 6B). In the low-level period of the fuse select signal FS, the fuse breakdown determination signal FD and the latch enable signal LE are sequentially turned to high levels (see points G and I in FIGS. 6D and 6G), so that the single-direction latch circuit 6 proceeds to latching the fuse breakdown determination result FJ regarding the fuse 1.

The third mode of FIGS. 6A-6H differs from the first mode of FIGS. 4A-4H such that the fuse breakdown determination circuits 5 determines the non-breakdown of the fuse 1, wherein the fuse breakdown determination result FJ is at the low level (see point H in FIG. 6E). That is, the single-direction latch circuit 6 receives the low-level fuse breakdown determination result FJ at the data terminal D when the latch enable signal LE becomes high. Thus, the connection node X is still maintained at the high level so that no change occurs on the internal potential condition of the single-direction latch circuit 6; hence, the latch output signal LO is maintained at the low level (see point J in FIG. 6H).

Next, upon reception of the second fuse breakdown pulse from the external device (see point "a" in FIG. 6B), the fuse breakdown determination control circuit 3 changes the fuse select signal FS from the low level to the high level (see point b in FIG. 6C), so that the selector 4 selects the fuse 2. Then, the fuse breakdown determination signal FD and the latch enable signal LE are sequentially turned to high levels (see points c and e in FIGS. 6D and 6G), so that the single-direction latch circuit 6 latches the fuse breakdown determination result FJ regarding the fuse 2.

Since the fuse 2 is broken down in the third mode, the fuse breakdown determination circuit 5 outputs the high-level fuse breakdown determination result FJ (see point d in FIG. 6E). Thus, the single-direction latch circuit 6 receives the high-level fuse breakdown determination result FJ at the data terminal D in response to the high-level latch enable signal LE.

For this reason, the connection node X decreases to a low level in the single-direction latch circuit 6 shown in FIG. 2, so that the latch output signal LO increases to a high level (see point f in FIG. 6H).

In short, the semiconductor memory device outputs the latch output signal LO, which is once decreased to the low level and is then increased to the high level, in the third mode where the fuse 1 is not broken down but the fuse 2 is broken down.

(4) Fourth Mode

The operation of the semiconductor memory device will be described with reference to FIGS. 7A-7H in respect to a fourth mode where both the fuses 1 and 2 are not broken down.

Since the fuse 1 is not broken down in the fourth mode, the fourth mode of FIGS. 7A-7H is similar to the third mode of FIGS. 6A-6H to such an extent that upon reception of the first fuse breakdown pulse from the external device, the single-direction latch circuit 6 latches the fuse breakdown determination result regarding the fuse 1. After completion of the fuse breakdown determination regarding the fuse 1, the potential of the connection node X of the single-direction latch circuit 6 is at a high level so that the latch output signal LO is maintained at a low level (see points A to J in FIGS. 7A to 7H).

Upon reception of the second fuse breakdown pulse from the external device (see point "a" in FIG. 7B), the fuse breakdown determination control circuit 3 changes the fuse select signal FS from the low level to the high level (see point b in FIG. 7C), thus controlling the selector 4 to select the fuse 2. In this state, the fuse breakdown determination signal FD and the latch enable signal LE are sequentially turned to high levels (see points c and e in FIGS. 7D and 7G), so that the single-direction latch circuit 6 latches the fuse breakdown determination result FJ regarding the fuse 2.

Since the fuse 2 is not broken down in the fourth mode, the fuse breakdown determination circuit 5 outputs the low-level fuse breakdown determination result FJ (see point d in FIG. 7E). That is, the single-direction latch circuit 6 receives the low-level fuse breakdown determination result FJ at the data terminal D in response to the high-level latch enable signal LE.

For this reason, the connection node X of the single-direction latch circuit 6 is maintained at the high level, so that the latch output signal LO is maintained at the low level (see point f in FIG. 7H).

In short, the semiconductor memory device continuously outputs the low-level latch output signal in the fourth mode in which both the fuses 1 and 2 are not broken down.

The operation of the semiconductor memory device can be summarized in consideration of the first to fourth modes such that, in the initial stage of the fuse breakdown determination upon reception of the fuse breakdown determination reset signal FR, the latch output signal LO of the single-direction latch circuit 6 is initialized to the low level; then, fuse breakdown determination is performed on the fuses 1 and 2 in turn so that the latch output signal LO is changed from the low level to the high level upon determination of the breakdown of one fuse; thereafter, the latch output signal LO is maintained at the high level irrespective of the fuse breakdown determination result whether or not another fuse is broken down.

In summary, the semiconductor memory device of the first embodiment is designed such that, as long as at least one of the fuses 1 and 2 is broken down, the latch output signal LO of the single-direction latch circuit 6 finally reaches the high level, which is maintained thereafter. Only in the fourth mode in which both the fuses 1 and 2 are not broken down, the latch output signal LO of the single-direction latch circuit 6 is finally maintained at the low level.

As described above, the semiconductor memory device of the first embodiment operates similarly to the foregoing semiconductor memory device of FIG. 9, but with a simpler constitution.

2. Second Embodiment

The single-direction latch circuit 6 used in the semiconductor memory device of the first embodiment is designed to output the high-level latch output signal LO only when the fuse breakdown determination result FJ is changed from the low level to the high level; however, the present invention is not limited to the first embodiment. It is possible to replace the single-direction latch circuit 6 accepting the transition from the low level to the high level with another single-direction latch circuit 6A accepting the transition from the high level to the low level shown in FIG. 8.

Figure 8:
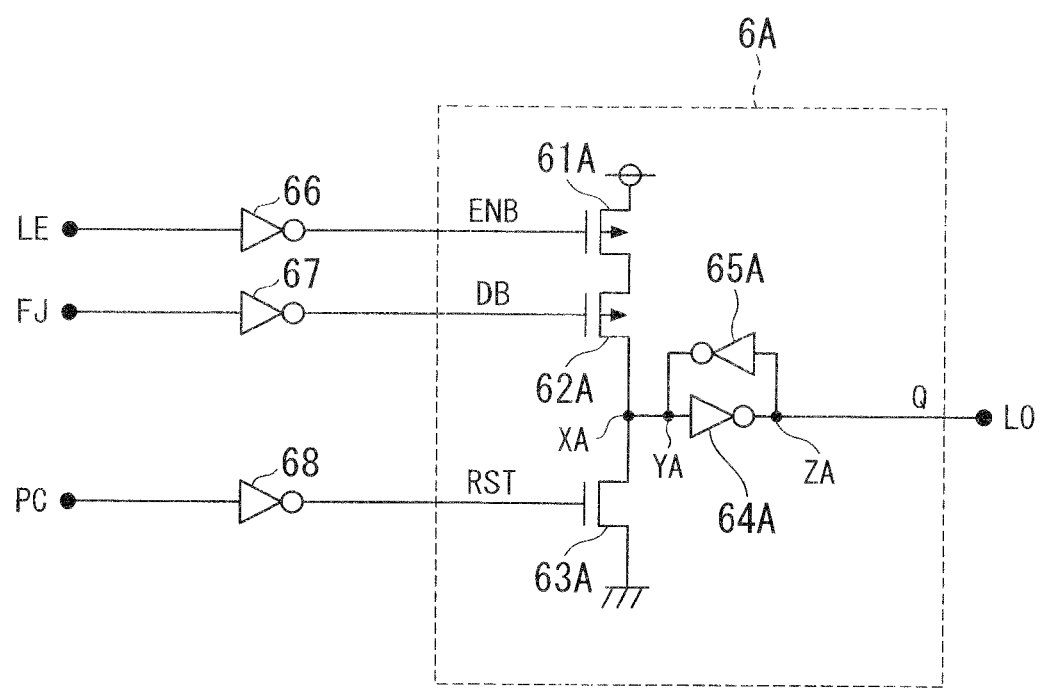
FIG. 8 is a circuit diagram showing the constitution of a single-direction latch circuit adapted to a semiconductor memory device according to a second embodiment of the present invention.

The single-direction latch circuit 6A of FIG. 8 is constituted of a first PMOS transistor 61A, a second PMOS transistor 62A, and a first NMOS transistor 63A, which are connected in series between the power-supply potential and the ground potential.

Specifically, the source of the first PMOS transistor 61A is connected to the power-supply potential, and the drain thereof is connected to the source of the second PMOS transistor 62A. The drain of the second PMOS transistor 62A is connected to the drain of the first NMOS transistor 63A. The source of the first NMOS transistor 63A is connected to the ground potential.

The single-direction latch circuit 6A further includes an output inverter 64A whose input terminal is connected to the drain of the first NMOS transistor 63A in connection with a connection node XA and a feedback inverter 65A whose input terminal is connected to the output terminal of the output inverter 64A and whose output terminal is connected to the input terminal of the output inverter 64A.

The output terminal of the feedback inverter 65A is connected to the connection node XA formed between the drain of the second PMOS transistor 62A and the drain of the first NMOS transistor 63A in connection with a connection node YA formed between the input terminal of the output inverter 64A and the output terminal of the feedback inverter 65A.

The gate of the first NMOS transistor 63A corresponds to a reset terminal RST of the single-direction latch circuit 6A, which receives a reset signal from an inverter 68 (serving as a second inverter) for inverting the precharge signal PC from the fuse breakdown determination control circuit 3.

The gate of the first PMOS transistor 61A corresponds to an enable-bar terminal ENB of the single-direction latch circuit 6A, which receives an enable-bar signal from an inverter 66 (serving as a third inverter) for inverting the latch enable signal LE from the fuse breakdown determination control circuit 3.

The gate of the second PMOS transistor 62A corresponds to a data-bar terminal DB of the single-direction latch circuit 6A, which receives a fuse breakdown determination result-bar from an inverter 67 (serving as a fourth inverter) for inverting the fuse breakdown determination result FJ from the fuse breakdown determination circuit 5.

In addition, the latch output signal LO is output from an output terminal Q of the single-direction latch circuit 6A corresponding to a connection node ZA formed between the output terminal of the output inverter 64A and the input terminal of the feedback inverter 65A.

In the semiconductor memory device of the second embodiment, the single-direction latch circuit 6A of FIG. 8 outputs the latch output signal LO at a high level only when both the fuses 1 and 2 are broken down.

Compared to the semiconductor memory device including the single-direction latch circuit 6 accepting only the transition from the low level to the high level, the semiconductor memory device including the single-direction latch circuit 6A is designed to output the high-level latch output signal LO only when all the fuses are broken down. Therefore, the second embodiment is effectively applied to a specific fuse failure mode in which fuses are easily broken down but are difficultly restored.

3. Variations

The first and second embodiments are each designed to output a single latch output signal LO based on the conditions of the two fuses 1 and 2; but the present invention is not necessarily adapted to two fuses but can be adapted to numerous fuses.

When the semiconductor memory device of the present invention is designed to use more than two fuses, the D-type flip-flop 33 and the first inverter 34 included in the fuse breakdown determination control circuit 3 shown in FIG. 3 are replaced with a counter circuit for counting the number of fuses. For example, when the semiconductor memory device uses a plurality of fuses the number of which is N (where N is an arbitrary natural number), the counter circuit varies the count number thereof from "0" to "N-1" every time it receives high-level pulses of the fuse breakdown determination pulse signal FP; then, it outputs the fuse select signal FS corresponding to the count value to the selector 4. Based on the fuse select signal FS, the selector 4 selects one of fuses.

The above semiconductor memory device is designed to receive a prescribed number of high-level pulses of the fuse breakdown determination pulse signal FP (corresponding to the number of fuses) subsequently to a high-level pulse of the fuse breakdown determination reset signal FR from the external device in the initial stage of the fuse breakdown determination.

Thus, the above semiconductor memory device is capable of performing fuse breakdown determination on more than two fuses by use of one single-direction latch circuit.

All the aforementioned semiconductor memory devices are designed to use fuses which are electrified with electric currents before breakdown but block electric currents passing therethrough after breakdown. Instead, it is possible to use anti-fuses which block electric currents before breakdown but allow electric currents passing therethrough after breakdown.

It is possible to modify the semiconductor memory device of FIG. 1 in such a way that the fuse breakdown determination result FJ of the fuse breakdown determination circuit 5 is inverted in logic so as to allow the single-direction latch circuit 6 to output the "low-level" latch output signal LO in the first mode in which both the fuses 1 and 2 are broken down.

As described above the semiconductor memory device of the present invention is characterized by using one single-direction latch circuit accepting only the transition from the low level to the high level or only the transition from the high level to the low level, wherein fuse breakdown determination results regarding plural fuses are sequentially input into the single-direction latch circuit at respective timings. This makes it possible to produce the AND result or OR result with regard to fuse breakdown determination results of plural fuses by use of one single-direction latch circuit.

Compared to the foregoing technologies disclosed in Patent Documents 1 and 2, the present invention demonstrates the following effects (1) Patent Document 1 discloses the technology in which two anti-fuses are connected to a MOS switch so as to perform an OR operation, wherein similar to the present invention, it may achieve the OR operation with a relatively small area of circuitry. However, the technology of Patent Document 1 is not designed to cope with an event of failure in which one anti-fuse is broken down and is thus connected to a desired potential (e.g. the power-supply potential VDD) while the other anti-fuse is accidentally short-circuited to an unwanted potential (e.g. the ground potential VSS), wherein the MOS switch coupled with two anti-fuses is set to a midpoint potential between VDD and VSS, which results in indetermination in respect to the fuse breakdown determination result and which makes it inoperable to perform the OR operation.

(2) In contrast to Patent Document 1, the present invention is capable of coping with the above event of failure because two anti-fuses are independently subjected to fuse breakdown determination so as to determine the breakdown of one anti-fuse and to determine the non-breakdown of the other anti-fuse, thus achieving the OR operation normally. That is, the present invention achieves the fuse breakdown determination with a high reliability.

(3) Compared to the technology of Patent Document 2, which arranges fuse latch circuits for two fuses respectively, the present invention reduces the number of fuse latch circuits, thus reducing the overall area of a chip.

(4) The present invention is not necessarily limited to semiconductor memory devices and is applicable to other semiconductor devices including memories, wherein nonvolatile elements are not restrictively used for internal voltage adjustment and timing adjustment after manufacturing and are applicable to various uses such as defective redundancy and manufacturing codes.

(5) The semiconductor memory device of the present invention can be designed using field-effect transistors (FET) such as metal-insulator semiconductor (MIS) transistors other than MOS transistors. In the claim language, PMOS transistors are referred to as first-conduction-type transistors, while NMOS transistors are referred to as second-conduction-type transistors.

Lastly, it is apparent that the present invention is not limited to the above embodiments, but may be modified and changed without departing from the scope and spirit of the invention.

What is claimed is:

1. A semiconductor device comprising:
a plurality of nonvolatile elements; and
a flip-flop having a set terminal and a reset terminal, which collectively stores a plurality of determination results with respect to the plurality of nonvolatile elements,
wherein an output terminal of the flip-flop is changed from a first logic level, which is initially set to the flip-flop via the reset terminal, to a second logic level in response to the plurality of determination results sequentially input into the set terminal of the flip-flop.

2. The semiconductor device according to claim 1, wherein a reset signal is supplied to the reset terminal of the flip-flop in an initial stage of determination on the plurality of nonvolatile elements.

3. The semiconductor device according to claim 1, wherein the flip-flop is constituted of a first transistor whose gate receives a first control signal and a second transistor whose gate receives a second control signal, which are connected in series between a first potential and a second potential, as well as an output inverter whose input terminal is connected to a connection node formed between the first transistor and the second transistor and whose output terminal is connected to the output terminal of the flip-flop, and a feedback inverter whose input terminal is connected to the output terminal of the output inverter and whose output terminal is connected to the input terminal of the output inverter, and wherein an internal state of the flip-flop is controlled based on the first control signal and the second control signal.

4. The semiconductor device according to claim 3, wherein the first logic level is changed between connecting the set terminal of the flip-flop to the gate of the first transistor and connecting the set terminal of the flip-flop to the gate of the second transistor.

5. The semiconductor device according to claim 4, wherein the flip-flop further includes a third transistor whose gate receives a third control signal for controlling the flip-flop to accept a transition from the first logic level to the second logic level, and wherein the first transistor and the third transistor are connected in series between the first potential and the connection node, or the second transistor and the third transistor are connected in series between the second potential and the connection node.

6. The semiconductor device according to claim 5, wherein the first control signal becomes active subsequently to the reset signal in the initial stage of determination on the plurality of nonvolatile elements.

7. The semiconductor device according to claim 1, wherein the nonvolatile elements are fuses subjected to laser beam cutting, fuses subjected to electric breakdown, or anti-fuses.

8. A semiconductor device comprising:
  a plurality of fuses or anti-fuses;
  a selector for sequentially selecting the plurality of fuses or anti-fuses; and
  a single-direction latch circuit for latching a fuse breakdown determination result representing a breakdown of the fuse or anti-fuse selected by the selector only when the fuse breakdown determination result is varied in a single direction from a low level to a high level or in a single direction from the high level to the low level.

9. The semiconductor device according to claim 8 further including a fuse breakdown determination circuit for determining whether or not the fuse or anti-fuse selected by the selector is broken down, thus outputting the fuse breakdown determination result to the single-direction latch circuit.

10. The semiconductor device according to claim 9 further including a fuse breakdown determination control circuit, which receives a fuse breakdown determination reset signal and a fuse breakdown pulse signal from an external device so as to generate a first control signal for controlling the selector, second and third control signals for controlling the single-direction latch circuit, and a fourth control signal for controlling the fuse breakdown determination circuit.

11. The semiconductor device according to claim 10, wherein the single-direction latch circuit is reset when the second control signal becomes active, and wherein the single-direction latch circuit is set to latch the fuse breakdown determination result when the third control signal becomes active.

12. The semiconductor device according to claim 10, wherein the fuse breakdown determination control circuit includes a first delay circuit which delays the fuse breakdown determination pulse signal so as to generate the fourth control signal, and a second delay circuit which delays the fourth control signal so as to generate the third control signal.

13. The semiconductor device according to claim 10, wherein the single-direction latch circuit for latching the fuse breakdown determination result which is varied in the single direction from the low level to the high level is constituted of a first transistor of a first-conduction-type field-effect transistor, a second transistor of a second-conduction-type field-effect transistor, and a third transistor of a second-conduction-type field-effect transistor, which are connected in series between a first potential and a second potential, as well as an output inverter whose input terminal is connected to a connection node formed between the first transistor and the second transistor and whose output terminal is connected to an output terminal of the single-direction latch circuit, and a feedback inverter whose input terminal is connected to the output terminal of the output inverter and whose output terminal is connected to the input terminal of the output inverter.

14. The semiconductor device according to claim 13, wherein the second control signal is supplied to a gate of the first transistor, wherein the fuse breakdown determination result output from the fuse breakdown determination circuit is supplied to a gate of the second transistor, and wherein the third control signal is supplied to a gate of the third transistor.

15. The semiconductor device according to claim 10, wherein the single-direction latch circuit for latching the fuse breakdown determination result which is varied from the high level to the low level is constituted of a first transistor of a first-conduction-type field-effect transistor, a second transistor of a first-conduction-type field-effect transistor, and a third transistor of a second-conduction-type field-effect transistor, which are connected in series between a first potential and a second potential, as well as an output inverter whose input terminal is connected to a connection node formed between the second transistor and the third transistor and whose output terminal is connected to an output terminal of the single-direction latch circuit, and a feedback inverter whose input terminal is connected to the output terminal of the output inverter and whose output terminal is connected to the input terminal of the output inverter.

16. The semiconductor device according to claim 15, wherein the second control signal is supplied to a gate of the third transistor, wherein the third control signal is supplied to a gate of the first transistor, and wherein the fuse breakdown determination result output from the fuse breakdown determination circuit is supplied to a gate of the second transistor.

17. A semiconductor device comprising:
  a plurality of fuses or anti-fuses; and
  a single-direction latch circuit for sequentially inputting a plurality of fuse breakdown determination results regarding the plurality of fuses or anti-fuses, thus outputting a logical sum or a logical product based on the plurality of fuse breakdown determination results.

* * * * *